United States Patent [19]
Fukuda et al.

[11] Patent Number: 5,338,619
[45] Date of Patent: Aug. 16, 1994

[54] COPPER FOIL FOR PRINTED CIRCUITS AND METHOD OF PRODUCING SAME

[75] Inventors: Katsuhito Fukuda, Kyoto; Masato Takami, Uji; Hirokazu Hasegawa, Kyoto; Chiaki Nakajima, Shiga; Kenji Isihara, Kyoto, all of Japan

[73] Assignee: Fukuda Metal Foil and Powder Co., Ltd., Kyoto, Japan

[21] Appl. No.: 924,527

[22] Filed: Aug. 4, 1992

[51] Int. Cl.$^5$ .............................. B32B 15/20
[52] U.S. Cl. ................. 428/623; 428/632; 428/624; 428/658; 428/674
[58] Field of Search ............ 428/658, 674, 632, 623, 428/624

[56] References Cited

U.S. PATENT DOCUMENTS

| | | | |
|---|---|---|---|
| 2,418,608 | 6/1947 | Thompson et al. | 148/258 |
| 4,082,591 | 4/1978 | Morisaki et al. | 156/150 |
| 5,071,520 | 12/1991 | Lin et al. | 205/197 |

FOREIGN PATENT DOCUMENTS

| | | |
|---|---|---|
| 54-29187 | 3/1979 | Japan . |
| 57-152490 | 9/1982 | Japan . |
| 58-7077 | 1/1983 | Japan . |
| 58-15950 | 1/1983 | Japan . |

*Primary Examiner*—Benjamin R. Fuller
*Assistant Examiner*—Valerie Ann Lund
*Attorney, Agent, or Firm*—Lowe, Price, LeBlanc & Becker

[57] ABSTRACT

A copper foil for printed circuits having a rust-preventive and heat-discoloration resistant coat, comprising a first layer of zinc or an alloy or a compound or a composition including zinc mainly, and a second layer including a silane coupling agent and phosphorus or a phosphorus compound, said second layer being positioned on the first layer. A method of producing a copper foil for printed circuits comprising the steps of treating the shiny side of a copper foil in a manner of cathode electrolysis in an alkaline solution including zinc ions and chrome ions, or providing the shiny side of a copper foil with a thin plating layer of zinc or a zinc alloy, and thereafter applying onto the treated surface of the copper foil a solution including a silane coupling agent and phosphorus or a phosphorus compound.

4 Claims, No Drawings

COPPER FOIL FOR PRINTED CIRCUITS AND METHOD OF PRODUCING SAME

BACKGROUND OF THE INVENTION (1) Field of the Invention

The present invention relates to a treated surface coat of a copper foil and more particularly to a copper foil for printed circuits which provides a heat-discoloration resistant and rust-proofing coat, and also a method of producing same.

(2) Description of the Prior Art

A printed circuit board is progressing rapidly nowadays and it is required to grade up its reliability and high efficiency. Of course, such requirements become more and more serious in tile case of a copper foil for printed circuits.

The first step of producing a printed circuit board is to laminate a copper foil on a resin impregnated base material under heat and pressure so as to obtain a copper-clad laminate. In this case, where paper-phenolic resin for consumer use is used as the material of the board, the temperature of pressing is set to be 150°–160° C. However, where glass-epoxy resin for industrial use is set to be 10°–20° C. higher in comparison with tile temperature in tile case of the paper-phenolic resin. Further, where plastics of high heat resistance or glass-polyimide resin, which is used increasingly nowadays, is used as the material of the board, it requires to set the temperature higher.

By the way, according to high density or high multiplication of the printed circuit board, it is required to carry out postcure after pressing process in order to minimize a rate of change of size thereof.

Therefore, the shiny side surface of the copper foil, which is not the side of the copper foil to contact with the base material, is normally affected with oxidation due to heat for a long time aging of the postcure with a high temperature, and if the shiny side surface is not treated, discoloration due to oxidation occurs strongly. As the result, no value is obtained by the copper foil in both its surface characteristics and its appearances.

Accordingly, Japanese patent publication No. 54-29187, for example, discloses a method of forming a coat by immerging a copper in an alkaline aqueous solution including zinc or by turning on an electric current to the copper as an anode in the aqueous solution. Japanese patent publication No. 58-7077, discloses a method of providing a coating layer of zinc or a compound which consists of zinc or zinc oxide and an oxide of chromium. Further, U.S. Pat. No. 4,082,591, discloses a method of providing a coating layer of copper-tin alloy. Further, Japanese patent laid-open publication No. 57-152490, discloses a method of electrolyzing a copper foil as a cathode in a solution which includes a hexavalent chrome compound, a water soluble zinc compound and sodium sulfate, and PH of which is set less than 6.5.

However, the above mentioned conventional methods have the following problems. In the case of deposited coat of chrome and zinc compounds or a copper-tin alloy coat, there is no heat resistance against a high temperature and a long time such as at 200° C. for 1 hour, or no heat resistance against postcure after lamination with a base material. Further, it is not sufficient in rust-preventing effects against oxidation in a change with the passage of time in keeping such coats until they are put in laminating processes.

Further, in the method of plating zinc, when an amount of zinc is increased, heat-discoloration resistance may be improved. However, when a great amount of zinc is deposited, its appearance presents a gray color and after lamination under pressure the color becomes ormolu, and the solderability becomes poor and its market value is lost.

SUMMARY OF THE INVENTION

The present invention has an object to provide a copper foil for a printed circuit board which solves the problems of the above-mentioned prior art.

To achieve the above object, the copper foil for the printed circuit board having a rust-preventive and heat-discoloration resistant coat, comprises a first layer of zinc or an alloy, a compound or a composition including zinc mainly, and a second layer including a silane coupling agent, and phosphorus or a phosphorus compound, said second layer being positioned on the first layer. If desired, the first layer may be formed by a composition or a compound which comprises zinc or zinc oxide and an oxide of chromium. Further, the first layer may be formed by zinc or a zinc alloy having a layer of an oxide of chromium obtained in a manner of a chromate treatment, said layer of an oxide of chromium being formed on the zinc layer or the zinc alloy layer.

A method of producing the copper foil according to the present invention comprises the steps of treating at least the shiny side of a copper foil in a manner of cathode electrolysis in an alkaline solution including zinc and chrome ions, and applying onto the treated surface of the copper foil a solution including a silane coupling agent, and phosphorus or a phosphorus compound to form a rust-preventive and heat-discoloration resistant coat.

Another method of producing the copper foil comprises the steps of providing at least the shiny side of a copper foil with a thin plating layer of zinc or a zinc alloy, treating the copper foil with a chromate treating, and applying onto the treated surface of the copper foil a solution including a silane coupling agent, and phosphorus or a phosphorus compound to form a rust-preventive and heat-discoloration resistant coat.

Namely, in view of the problems raised in the above-mentioned prior art, the inventors have carried out a research in various ways and found that a copper foil having a heat-discoloration and rust-preventive resistant coat can be obtained by adding to a heat-discoloration and rust-preventive resistant coat a second layer which comprises a silane coupling agent, and phosphorus or a phosphorus compound.

ADVANTAGES OF THE INVENTION

Namely, the heat-discoloration and rust-preventive resistant coat of the present invention has progressed greatly in heat-discoloration resistance in comparison with comparative examples (See Table-2), and particularly it is superior in heat resistance in postcure (heat after lamination). Further, it has an advantage of rust-preventing effects against oxidation in a change with the passage of time. Additionally, the second layer is a very thin coat, but its heat-discoloration resistance is superior and it is advantageous in solderability and adhesion of regist.

Other objects and advantages of the present invention will be apparent from the detailed description of the following embodiments.

DESCRIPTION OF THE EMBODIMENTS

EMBODIMENT-1

The shiny side of a copper foil having thickness of 35 μm was electrolyzed as a cathode with the current density of 2A/dm$^2$ in the bath-A for ten seconds. The bath-A included tile following materials and conditions:

| | | |
|---|---|---|
| (1) $K_2Cr_2O_7$ | 15 g/l | |
| (2) $ZnSO_4.7H_2O$ | 25 g/l | |
| (3) NaOH | 70 g/l, and | |
| (4) temperature | 30° C. | |

After rinsing the copper foil with water, the copper foil was sprayed with tile following solution-B and dried.

| | | |
|---|---|---|
| (B) γ-aminopropyltriethoxysilane | 1.0 cc/l | |
| phosphoric acid (85%) | 0.13 cc/l; | |

Table-2 shows the test results of the characteristics of the copper foil. The amount of Zn in the heat-discoloration and rust-preventive resistant coat was 7.0 mg/m$^2$. Also, the amount of Cr was 1.8 mg/m$^2$, Si was 4 mg/m$^2$, and P was 2 mg/m$^2$. Analysis of each of Zn, Cr and Si was carried out in a manner of I.C.P. emission spectrochemical analysis. Also analysis of P was carried out in a manner of absorptiometry.

EMBODIMENT-2

The shiny side of a copper foil having thickness of 35 μm was electrolyzed as a cathode with the current density of 0.15 A/dm$^2$ in the bath-C for three seconds instead of the bath-A in the first embodiment, so as to obtain a thin plating of zinc. The bath-C included the following materials and conditions:

| | | |
|---|---|---|
| (1) $ZnSO_4.7H_2O$ | 25 g/l | |
| (2) NaOH | 70 g/l, | |
| (3) temperature | 25° C. | |

After rinsing the copper foil with water, the copper foil was electrolyzed as a cathode with the current density of 0.2A/dm$^2$ for three seconds in the bath which included the following materials and conditions:

| | | |
|---|---|---|
| (1) $Na_2Cr_2O_7.2H_2O$ | 3 g/l | |
| (2) NaOH | 3 g/l, | |
| (3) temperature | 25° C. | |

Then, rinsing the copper foil with water, the copper foil was sprayed with the same solution as the solution-B of the first embodiment, and dried.

Table-2 shows the test results of the characteristics of the copper foil.

EMBODIMENTS 3–8

The shiny side of a copper foil having thickness of 35 μm was electrolyzed as a cathode with the current density of 2 A/dm$^2$ for ten seconds in the bath which was the sane as the bath-A in the first embodiment. After rinsing the copper foil with water, the copper foil was sprayed with a solution which included a silane coupling agent and a phosphorus compound, which are shown in Table-1, and dried.

Table-2 shows the test results of the characteristics of the copper foil in Embodiments 3–8.

TABLE 1

Second Layer Treating bath compositions (aqueous solution)

| Embodiments | | |
|---|---|---|
| 3 | N-β-aminoethyl-γ-aminopropyltrimethoxysilane | 0.5 cc/l |
| | Phosphoric acid (85%) | 0.08 cc/l |
| 4 | γ-glycidoxpropyltrimethoxysilane | 0.5 cc/l |
| | Lithium phosphate | 0.1 g/l |
| 5 | γ-aminopropyltriethoxysilane | 0.6 cc/l |
| | Lithium phosphate | 0.1 g/l |
| 6 | γ-aminopropyltriethoxysilane | 0.5 cc/l |
| | Phosphoric acid (85%) | 0.07 cc/l |
| 7 | γ-aminopropyltriethoxysilane | 0.5 cc/l |
| | Phosphoric acid (85%) | 0.07 cc/l |
| 8 | γ-aminopropyltriethoxysilane | 0.5 cc/l |
| | Phosphoric acid (85%) | 0.02 cc/l |
| Comparative Examples | | |
| 1 | None | |
| 2 | N-β-aminoethyl-γ-aminopropyltrimethoxysilane | 0.5 cc/l |
| 3 | Trisodium phosphate 12-water | 0.2 g/l |

COMPARATIVE EXAMPLE-1

The shiny side of a copper foil having thickness of 35 μm was electrolyzed as a cathode with the current density of 2 A/dm$^2$ for ten seconds in the bath which was the same as the bath-A in tile first embodiment. After rinsing the copper foil, it was dried.

Table-2 shows the test results of the characteristics of the copper foil.

TABLE 2

| | Heat Discoloration of Copper foil 200° C. | | Postcure 200° C. | | Solderability | Adhesion of regist | Rust-preventing test |
|---|---|---|---|---|---|---|---|
| | 30 min. | 60 min. | 30 min. | 60 min. | | | |
| Embodiments | | | | | | | |
| 1 | ○ | ○ | ○ | ○ | ○ | ○ | ○ |
| 2 | ○ | ○ | ○ | ○ | ○ | ○ | ○ |
| 3 | ○ | ○ | ○ | □ | ○ | ○ | ○ |
| 4 | ○ | ○ | ○ | ○ | ○ | ○ | ○ |
| 5 | ○ | ○ | ○ | ○ | ○ | ○ | ○ |
| 6 | ○ | ○ | ○ | ○ | ○ | ○ | ○ |
| 7 | ○ | ○ | ○ | ○ | ○ | ○ | ○ |
| 8 | ○ | ○ | ○ | △ | ○ | ○ | ○ |
| Comparative Examples | | | | | | | |
| 1 | ○ | X | X | XX | ○ | ○ | △ |

TABLE 2-continued

| | Heat Discoloration of Copper foil 200° C. | | Postcure 200° C. | | Solderability | Adhesion of regist | Rust-preventing test |
| --- | --- | --- | --- | --- | --- | --- | --- |
| | 30 min. | 60 min. | 30 min. | 60 min. | | | |
| 2 | X | XX | XX | XX | ○ | ○ | ○ |
| 3 | ○ | ○ | X | XX | ○ | ○ | X |

COMPARATIVE EXAMPLE-2

The shiny side of a copper foil having thickness of 35 μm was electrolyzed as a cathode with the current density of 2 A/dm² for ten seconds in the bath which was the same as the bath-A in the first embodiment. After rinsing the copper foil, the copper foil was sprayed with the aqueous solution which included 0.5 cc/l of N-β-aminoehyl-γ-aminopropyltriethoxysilane, and then dried.

Table-2 shows the test results of the characteristics of the copper foil.

COMPARATIVE EXAMPLE-3

The shiny side of a copper foil having thickness of 35 μm was electrolyzed as a cathode with the current density of 2 A/dm² for ten seconds in the bath which was the same as the bath-A in the first embodiment. After rinsing the copper foil, the copper foil was sprayed with the aqueous solution which included 0.5 g/l of trisodium phosphate 12-water, and then dried.

Table-2 shows the test results of the characteristics of the copper foil.

By the way, "heat discoloration of the copper foil" in Table-2 shows heating and oxidation discoloration of the shiny side of the copper foil as simple substance in an oven which provides a heated air circulation system. Further, "postcure" shows heating and oxidation discoloration of the shiny side of the copper foil in the same oven, which copper foil is being laminated and pressed on glass-epoxy resin of FR-4 grade.

Judgements of the test results using marks are as follows:
○: No discoloration,
□: Slight discoloration,
Δ: Little discoloration,
X: Discoloration overall, and
X X: Strong discoloration overall.

Further, solderability was based on items 4–12 of IPC-CF-150E, and it is tested in such a manner that the copper foil was immerged in an aqueous solution of 1/10N hydrochloric acid having a temperature of 25° C. for ten seconds and thereafter it was washed with water and dried. Then, it is applied WWG rosin flux and thereafter immerged in solder of 235° C., and its solderability was visually examined. The mark ○ shows that the whole of the copper surface is wetting.

Adhesion of regist to copper foil surface was measured by using pencil lead hardness. The copper foil was pressed on a glass-epoxy resin of FR-4 grade and UV solder regist was printed by means of a screen print and it was cured by means of a UV exposure equipment and then the coating hardness was measured. The mark ○ shows that its hardness was more than 4H.

Rust-preventing test was visually inspected. The copper foil was maintained for 72 hours in a thermohygrostat which was kept its relative humidity at 85% at the temperature of 60° C., and then its oxidation discoloration was inspected. Judgements are given with marks ○, Δ, and X in order from one which was better.

The followings are should be noted in understanding the present invention.

Preferably, the amount of a silane coupling agent is 0.01–20 mg/m² as Si, and more preferably 0.1–10 mg/m².

The amount of phosphorus or a phosphorus compound, is 0.01–20 mg/m² as P, and more preferably 0.1–10 mg/m². When the amount of each of Si and P is little, it is not effective in heat-discoloration resistance of the present invention, and when the amount is much, its appearance is not good since it occurs unevenness in dry or the copper foil becomes stained.

The method of coating tile second layer can be achieved by spraying an aqueous solution including a silane coupling agent and a phosphorus compound or an organic solution onto a surface of the copper foil or by immerging tile copper foil in the solution and then drying same. The silane coupling agent and the phosphorus compound may be treated continuously and independently, but it is advantageous in view of treating processes that these treatments may be carried out simultaneously.

The silane coupling agent is one which is presented by a general expression $YRSiX_3$, wherein: Y is a functional group which reacts with polymer, R is a coupling group including hydrocarbon to couple Y and Si, and X is a hydrolyzing group which couples with Si. For instance, γ-aminopropyltriethoxysilane, N-β-aminoethyl-γ-aminopropyltrimethoxysilane, γ-glycidoxytrimethoxysilane, and γ-ureidopropyltriethoxysilane, may be used for the silane coupling agent.

As the phosphorus or the phosphorus compound, it may list up for instance phosphoric acid, alkali metal salt of phosphoric acid, tripolyphosphoric acid, alkali metal salt of tripolyphosphoric acid, pyrophosphoric acid, alkali metal salt of pyrophosphoric acid, triethyl phosphate, trimethyl phosphate. However, sodium salt and potassium salt of phosphoric acid and so on are effective in heat-discoloration resistance, but rust-preventing effects may be decreased when their amounts are much. Therefore, when they are used, its amount should be little, otherwise they should not be used. Lithium salt of phosphoric acid and so on is effective in rust-preventing effects.

As an example using an aqueous solution including phosphoric acid, it is preferable to set the phosphoric acid (85%) within a range of 0.01–0.5 cc/l and the silane coupling agent is to be set within a range of 0.01–10 g/l.

When the solution of the phosphorus compound and the silane coupling agent is an aqueous solution, its pH should be 5.0–12.0 and more preferably 6.0–11.0. This is the reason that Zn in the first layer is solved and removed when the pH is set beyond the range.

When either of the phosphorus compound or the silane coupling agent is used, heat-discoloration resistance of the copper foil becomes lowered and therefore only both of the essential elements bring about the above-mentioned advantages of this invention.

The first layer of this invention is, of course, treated prior to the second layer. It may cite Cr, Cu, Ni, Co, Sn, Mg, Al, Si, P, Mo, W and V, as additional elements for a compound or a composition layer or an alloy layer which includes zinc mainly, and it may choose one of them but its main element is Zn and a representative of the additional elements is Cr. As a method of forming the first layer, a layer of Zn and Cr compositions may be formed by such as a method which is disclosed in Japanese patent publication No. 58-15950. However, it may take such a manner that the first layer may be obtained by plating zinc or a zinc alloy on the copper foil surface with a very thin thickness. In this case, it is better to give a chromate treatment to a surface of zinc or a zinc alloy of the copper foil so that both of heat-discoloration resistant and rust-preventing effects may be increased. The coating amount of Zn or Zn compounds is 1–50 mg/m$^2$ as Zn and preferably 3–20 mg/m$^2$ as Zn.

When the amounts of Zn and Cr are little, heat-discoloration resistance becomes lowered even if the second layer includes them with a suitable amount, and when the amounts are much, solderability is lowered or it has a problem in color of its appearance.

What is claimed is:

1. A copper foil for printed circuits having a heat-discoloration and a rust-preventive resistant coat on a shiny side thereof, comprising:
   a first layer of a zinc composition comprising zinc and an oxide of chromium formed on the shiny side of said copper foil, and
   a second layer comprising a silane coupling agent containing 0.01–20 mg/m$^2$ of Si and a phosphorous compound with 0.01–20 mg/m$^2$ of phosphorous formed on the first layer.

2. The copper foil of claim 1 wherein said zinc composition includes 1–50 mg/m$^2$ of zinc.

3. A copper foil for printed circuits having a heat-discoloration and a rust-preventive resistant coat on a shiny side thereof, comprising:
   a first layer of zinc of a zinc alloy formed on the shiny side of said copper foil, a second layer of a chromium oxide formed by chromate treatment on said first layer, and
   a third layer comprising a silane coupling agent with 0.01–20 mg/m$^2$ of Si and a phosphorus compound with 0.01–20 mg/m$^2$ of phosphorous formed on the second layer.

4. The copper foil of claim 3 wherein said zinc or said zinc alloy includes 1–50 mg/m$^2$ of zinc.

* * * * *